United States Patent [19]

Medaugh

[11] Patent Number: 4,475,213
[45] Date of Patent: Oct. 2, 1984

[54] DIGITAL CODE CONVERTER

[75] Inventor: Raymond S. Medaugh, Middletown, N.J.

[73] Assignee: AT&T Bell Laboratories, Murray Hill, N.J.

[21] Appl. No.: 453,502

[22] Filed: Dec. 27, 1982

[51] Int. Cl.$^3$ ............................................ H04L 25/16
[52] U.S. Cl. ................................ 375/27; 340/347 DD
[58] Field of Search ....................... 375/26, 27, 33, 34, 375/122, 25; 340/347 DD, 347 CC, 347 DA; 371/1, 3, 4, 6, 71; 332/11 D; 358/133, 138, 260

[56] References Cited

U.S. PATENT DOCUMENTS

| | | | |
|---|---|---|---|
| 4,179,659 | 12/1979 | Tashiro | 375/27 |
| 4,296,412 | 10/1981 | Mastner | 375/26 X |
| 4,323,885 | 4/1982 | Carriere et al. | 340/347 CC |
| 4,363,024 | 12/1982 | Brokaw | 375/26 X |
| 4,384,278 | 5/1983 | Benjamin | 375/34 X |

FOREIGN PATENT DOCUMENTS 120571   9/1979   Japan ....................................... 375/26

OTHER PUBLICATIONS

Johnson et al., "Adaptive Rate Delta Modulator", IBM TDB, vol. 15, No. 11, Apr. 1973, pp. 3338-3341.
Narayanasami et al., "A Design Technique for Nonuniform Quantizer in PCM Generation", IEEE Trans. on Circuits and Systems, vol. CAS-29, No. 3, Mar. 1982, pp. 193-196.
"A Low Noise ADPCM-LOG PCM Code Converter", by Hideyo Murakami, 1979 International Symposium on Circuits and Systems Proceedings, IEEE Cat. No. 79 CH1421-7 CAS, pp. 969-970, Jul. 17-19, 1979.
"Proposal for a Transcoding Algorithm", CCIT-T-Q.7/XVIII, Expert Group on 32 kbit/s Codecs, Dec. 1982, pp. 1-10, Japan, Discussed in the Specification.

Primary Examiner—Benedict V. Safourek
Attorney, Agent, or Firm—Thomas Stafford

[57] ABSTRACT

Accumulation of distortion possibly resulting from multiple digital code conversions is prevented by including in an ADPCM-to-PCM decoder (100, FIG. 1 or 600, FIG. 6) an arrangement (119, FIG. 1 or 601, FIG. 6) for making a trial transmission of the resulting PCM sample ($\Psi(k)$) to obtain (via 209, FIG. 2) a composite noise value ($\alpha(k)$) for the PCM sample ($\Psi(k)$). The composite noise value includes noise components resulting from both quantizing the code word and truncating digital signals used in the decoder and subsequent coder. The composite noise value is evaluated (via 211) to determine whether adjustment of the PCM sample value ($\Psi(k)$) is necessary.

In one embodiment (FIG. 1, 100), a reconstructed linear version ($Y_r(k)$) of the PCM sample is adjusted (via 216, 218, 220 or 221) when the composite noise value ($\alpha(k)$) is not within the ADPCM quantizer interval for the ADPCM sample ($I_n(k)$) being converted to PCM. The amount of adjustment is dependent on the PCM quantizer interval (214) that the reconstructed signal ($Y_r(k)$) falls in and whether the ADPCM sample is in saturation, i.e., the most positive (215) or negative (217) ADPCM quantizer interval, or not in saturation (219).

In another embodiment (FIG. 6, 600), the decoder (600) PCM output sample ($\Psi(k)$) is adjusted, if necessary, up or down one PCM quantizer interval (via 802 or 803) when the composite noise value ($\alpha(k)$) is not within the quantizer interval decision levels of the ADPCM sample received by the decoder 600.

20 Claims, 8 Drawing Figures

DIGITAL CODE CONVERTER

TECHNICAL FIELD

This invention relates to digital code conversion and, more particularly, to preventing the accumulation of distortion in a communications channel including multiple code conversions.

BACKGROUND OF THE INVENTION

Over the past several years there has been, and continues to be, a tremendous amount of activity in the area of efficient encoding of speech. For an evolving digital telephone network, a most important application is the possible replacement of the 64,000 bit-per-second (b/s) PCM signal (8 bits per time slot, repeated at an 8 kHz rate) with other coding algorithms for telephony—both in the public switched and private line networks. The reason, of course, is to achieve bandwidth compression.

For a realistic mix of input speech and voiceband data, adaptive differential PCM appears to be a most promising approach. One form of adaptive differential PCM coding is disclosed, for example, in copending application Ser. No. 343,355, filed Jan. 27, 1982 now U.S. Pat. No. 4,437,087 issued Mar. 13, 1984 and can be considered a benchmark since a single encoding with this ADPCM coder at 32 kb/s is near to being subjectively equivalent to 64 kb/s $\mu$255 PCM. In some communications networks, however, it is possible to encounter multiple conversions from 64 kb/s PCM-to-32 kb/s ADPCM-to-64 kb/s-PCM. In these applications, it is important to prevent accumulation of distortion in the multiple PCM-to-ADPCM-to-PCM code conversions because of noise caused by quantizing the digital signals and noise caused by truncating values of digital signals used in the code converters.

An attempt towards this goal is described in an article by Hideyo Murakami entitled, "A Low Noise ADPCM-Log PCM Code Converter", 1979 *International Symposium on Circuits and Systems Proceedings,* IEEE catalog No. 79 CH1421-7 CAS, pages 969-970. However, the disclosed arrangement assumes a uniform ADPCM quantizer characteristic and distortion could result in those applications in which a non-uniform quantizer characteristic is employed. Additionally, the truncation noise problem is apparently not addressed.

More recently, possible distortion accumulation because of multiple code conversions is prevented in an ADPCM codec by controllably modifying the ADPCM code word as disclosed in copending application Ser. No. 435,968, filed Oct. 22, 1982 now U.S. Pat. No. 4,437,087. One problem with the disclosed arrangement is that one portion of the distortion prevention accumulation algorithm is included in the PCM-to-ADPCM coder while another portion is included in the ADPCM-to-PCM decoder. Another problem is that possible distortion caused by truncating digital signals, i.e., eliminating factional portions of digital signals used in processing is not addressed directly. In this prior arrangement, certain values of the ADPCM quantizer scale factors have been excluded from use in an attempt to eliminate noise caused by truncating the digital signals. Unfortunately, the ADPCM quantizer scale factor values to be excluded must be found experimentally, which can be a time consuming and tedious procedure. Moreover, it is still not known if distortion will result under certain signal conditions.

Thus, although the prior known arrangements may function satisfactorily in certain applications, they may not function satisfactorily in others.

SUMMARY OF THE INVENTION

Accumulation of distortion possibly resulting from multiple digital code conversions in a digital transmission network is prevented, in accordance with an aspect of the invention, by including in a decoder for converting digital signals from a second code to a first code an arrangement for making a so-called "trial transmission" of a converted second-to-first code sample to obtain a composite noise value for that sample. The composite noise value includes components resulting from both quantizing the sample and truncating digital signals used in the codec. The composite noise value is evaluated to determine whether a subsequent first-to-second code coder will ultimately generate the same second code sample as received by the second-to-first code decoder. If it is determined that the subsequent coder would generate a second code sample different from that received by the decoder, then the value of the first code sample generated by the decoder is controllably adjusted so that a subsequent encoder will ultimately generate the same second code sample value as received by the decoder.

In one embodiment, a so-called reconstructed first code linear sample value is adjusted when the composite noise value is not within limits related to the second code quantizer interval decision levels determined by the second code sample received by the decoder. The adjustment value is dependent on the corresponding first code sample quantizer interval that the reconstructed first code sample falls in and a predetermined adjustment scaling factor determined in relationship to the second code quantizer characteristic being employed. A first predetermined adjustment scaling factor is employed when the second code sample is the most positive or most negative second code quantizer interval, i.e., in saturation, and a second predetermined adjustment scaling factor is employed when the second code sample is not in saturation.

In another embodiment, a first code version of the reconstructed first code sample is adjusted up or down one first code quantizer interval when the composite noise value is not within limits related to the second code quantizer interval decision levels determined by the second code sample received by the decoder. Whether the adjustment is up one first code quantizer interval or down one first code quantizer interval is dependent on whether the second code sample is in positive or negative saturation, respectively, or is dependent on whether the value of the composite noise is greater than or equal to the upper decision level, or less than the lower decision level, respectively, for the second code sample quantizer interval received by the decoder.

BRIEF DESCRIPTION OF THE DRAWING

The invention will be more fully understood from the following detailed description of an illustrative embodiment taken in connection with the appended figures in which.

DETAILED DESCRIPTION

Figure 1:
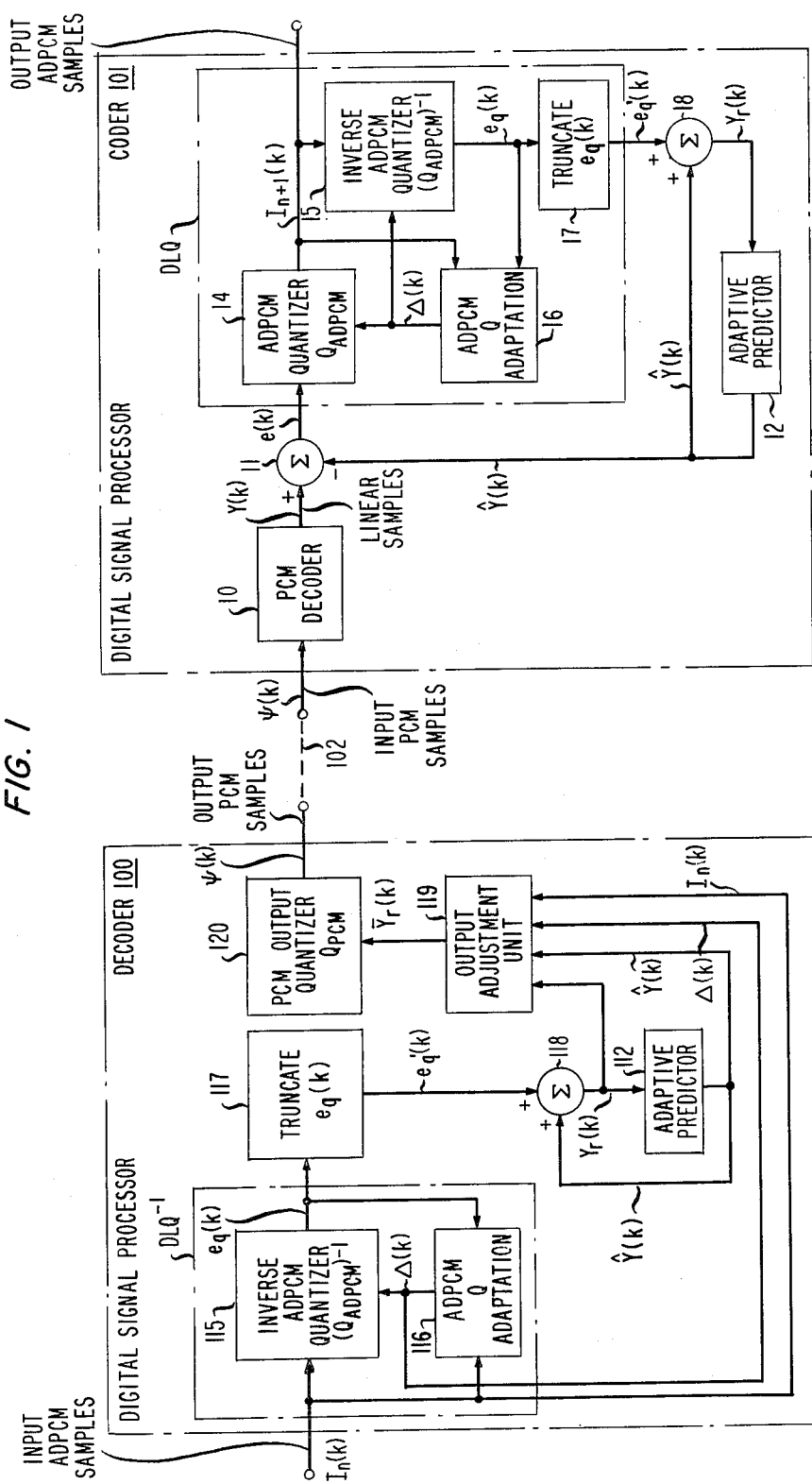
FIG. 1 shows in simplified block diagram form a code converter including an embodiment of the invention.

FIG. 1 illustrates in simplified block diagram form decoder 100 including an aspect of the invention and coder 101. Decoder 100 receives input samples $I_n(k)$ of a second code, for example, n-bit differential PCM and decodes the same into a first code, for example, $\mu 255$ PCM. The first code sample $\Psi(k)$ is transmitted over transmission facility 102 to a subsequent coder 101. Coder 101 converts first code sample $\Psi(k)$ into a second code sample $I_{n+1}(k)$. For purposes of illustration, a 4-bit differential PCM signal (n=4) shall be assumed. This 4-bit differential signal in conjunction with an adaptive differential PCM (ADPCM) coding algorithm to be described hereinafter provides very reliable, robust transmission for both speech and higher speed, voiceband data (e.g., 4800 b/s)—as well, of course, for lower speed data and tone signals. However, it is to be understood that the invention is in no way limited to this 4-bit differential transmission and n could be any other number, e.g., n=2, n=3, n=5, etc. If the input PCM samples were always representative of encoded speech, then a 2-bit differential PCM signal (i.e., n=2) should prove adequate for many applications.

In order to simplify the descriptive, ADPCM coder 101 of FIG. 1 is described first. ADPCM coder 101 is essentially identical to the coder described in copending U.S. patent application Ser. No. 343,355, filed Jan. 27, 1982, cited above.

Accordingly, PCM input samples $\Psi(k)$ are supplied to inverse PCM decoder 10 which converts the PCM samples, for example, $\mu 255$ PCM, to multi-bit linear PCM samples Y(k) in well-known fashion. The multi-bit (e.g., 13–16 bits) linear PCM samples Y(k) are delivered to algebraic difference circuit 11. It is noted that samples $\Psi(k)$ are not limited to PCM and could also be PAM samples. Of course, other non-uniform signals such as an A-law PCM signal may also first have to be converted to its linear PCM counterpart. Such conversions are known in the art and comprise no part of the present invention.

Adaptive predictor 12 provides a predicted sample estimate $\hat{Y}(k)$ which is a prediction or an estimate of linear sample Y(k). This predicted linear sample estimate $\hat{Y}(k)$ is delivered to a difference (−) input of the difference circuit 11 and to an input of adder 18. Accordingly, difference circuit 11 provides at its output difference signal e(k) that is the algebraic difference of the two inputs thereto, namely $e(k) = Y(k) - \hat{Y}(k)$. Adaptive predictors which may be advantageously employed herein are disclosed in copending application Ser. No. 343,355 (D. W. Petr Case 1) cited above and copending application Ser. No. 368,394, filed Apr. 14, 1982 (W. R. Belfield Case 1).

Figure 5:
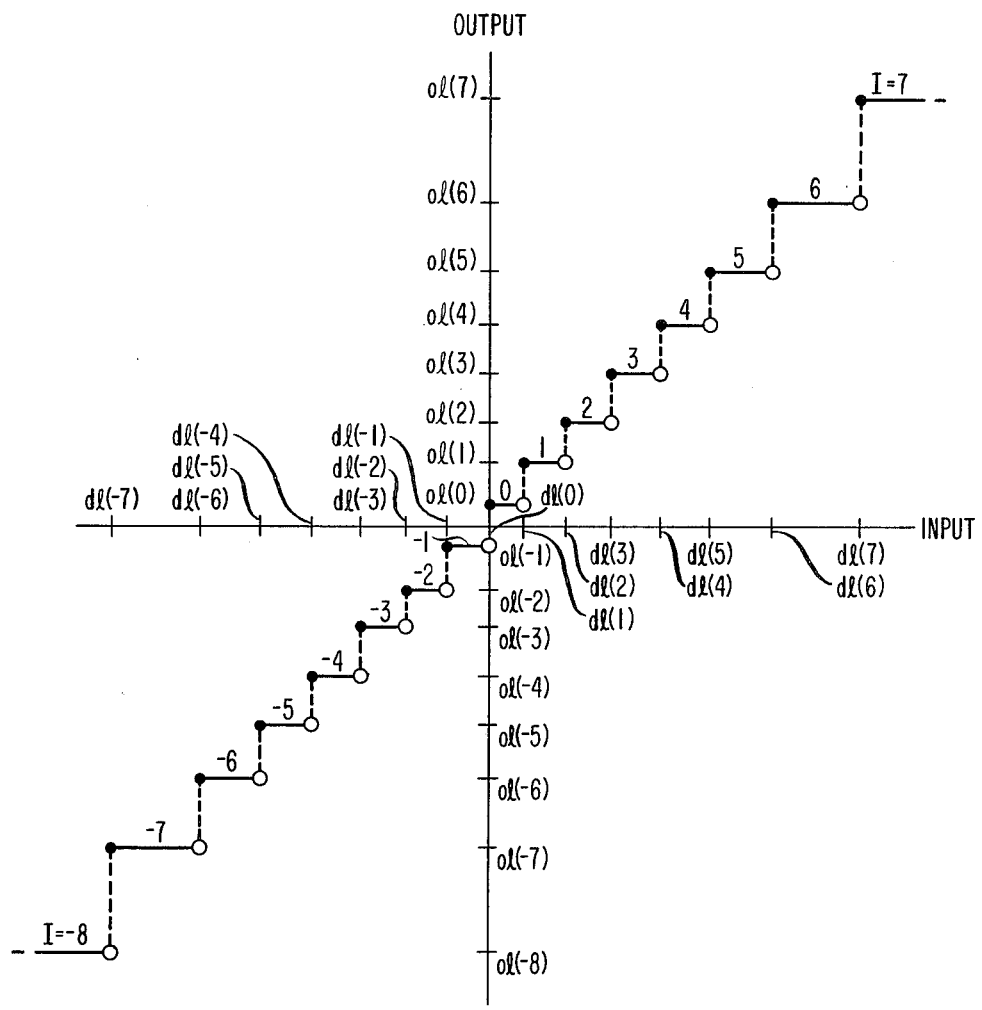
FIG. 5 illustrates in graphical form an unscaled nonuniform quantizer characteristic useful in describing the invention.

Difference signal e(k) is coupled to the input of the dynamic locking quantizer (DLQ). The DLQ comprises a 16 level (for n=4) non-uniform ADPCM quantizer 14 of scale factor $\Delta(k)$. One example of a nonuniform ADPCM quantizer characteristic is shown in FIG. 5. It is noted, however, that the invention is not dependent on the specific type of ADPCM quantizer characteristic. As will be appreciated by those skilled in the art, ADPCM quantizer 14 not only provides the desired quantization, but it also serves to PCM encode the input signal; the quantizing and encoding are carried out in one-and-the-same operation. The 4-bit output sample $I_{n+1}(k)$ represents the quantized and differential PCM encoded form of the difference sample e(k). Such quantizer arrangements are known in the art.

The 4-bit differential PCM output $I_{n+1}(k)$ is delivered to inverse ADPCM quantizer $(Q_{ADPCM})^{-1}$ 15 which, as the designation implies, performs an operation that is essentially the inverse of the operation of ADPCM quantizer 14. That is, inverse ADPCM quantizer 15 receives the 4-bit differential PCM signal $I_{n+1}(k)$ and provides at its output signal $e_q(k)$. This $e_q(k)$ signal is the quantized version of difference signal e(k). Signal $e_q(k)$ is coupled to the input of ADPCM Q adaptation circuit 16 and to truncate unit 17. Truncate unit 17 is employed to limit digital signal $e_q(k)$ to a finite number of bits. In this example, signal $e_q(k)$ is limited to an integer $e_q'(k)$, i.e., the fractional portion of $e_q(k)$ is truncated. As described hereinafter, this truncation may lead to noise in the PCM output sample $\Psi(k)$ from decoder 100 that can cause distortion to result in an ADPCM sample $I_{n+1}(k)$ to be generated in ADPCM coder 101. Truncated signal $e_q'(k)$ is supplied to one input of adder 18. The Y(k) output of adaptive predictor 12 is also coupled to an input of adder 18 and to ADPCM quantizer 14. Adder 18 adds the $e_q'(k)$ and Y(k) signals to generate at its output reconstructed signal $Y_r(k)$ which is in linear PCM form. Reconstructed signal $Y_r(k)$ is delivered to adaptive predictor 12, which in response thereto serves to generate the next predicted sample for comparison with the next linear PCM sample Y(k). Adaptive predictor 12 uses reconstructed signal $Y_r(k)$ and a few previous samples to arrive at prediction $\hat{Y}(k)$ which is the weighted sum of m input samples (e.g., m=4).

ADPCM Q adaptation circuit 16 receives quantized difference signal $e_q(k)$ and the 4-bit output $I_{n+1}(k)$, and serves to develop therefrom adaptive scale factor $\Delta(k)$. This adaptive scale factor $\Delta(k)$ is then delivered to ADPCM quantizer 14 and inverse quantizer 15. Adaptive scale factor $\Delta(k)$ serves to scale the $Q_{ADPCM}$ and $(Q_{ADPCM})^{-1}$ characteristics of quantizer 14 and inverse quantizer 15, respectively, to match the power of input difference signal e(k). ADPCM Q adaptation circuit 16 controls the speed of adaptation of the adaptive scale factor $\Delta(k)$; a fast speed of adaptation is provided when the input linear PCM signal represents speech, with a very slow (almost constant) speed of adaptation for input PCM encoded voiceband data or tones as described in the copending application Ser. No. 345,355 cited above.

The 4-bit differential PCM sample $I_{n+1}(k)$ is transmitted from coder 101, in typical time-division multiplexed fashion, over a digital transmission facility to be delivered to the input of a subsequent ADPCM decoder similar to decoder 100. Decoder 100, including an aspect of the invention, receives ADPCM input samples $I_n(k)$ which are supplied to inverse ADPCM quantizer 115 and to output adjustment unit 119. Inverse ADPCM quantizer 115 is identical to ADPCM inverse quantizer 15 and it serves to provide at its output the quantized difference signal $e_q(k)$. Again, as before, $e_q(k)$ represents the quantized version of the difference signal $e(k)$. It should be noted that although the same symbols are used for signals in decoder 100 and coder 101, the signals may be slightly different because of transmission errors and the like. The quantized difference signal $e_q(k)$ is coupled to the input of ADPCM Q adaptation circuit 116 and to truncate unit 117. Truncate unit 117 is identical to truncate unit 17 and is employed to limit digital signal $e_q(k)$ to a finite number of bits. In this example, signal $e_q(k)$ is limited to be an integer $e_q'(k)$, i.e., the fractional portion of $e_q(k)$ is truncated. This truncation can contribute to noise in the PCM output sample $\Psi(k)$ which may lead to distortion in a subsequent PCM-to-ADPCM coder, e.g., in coder 101. The input differential PCM signal $I_n(k)$ is also coupled to the input of ADPCM Q adaptation circuit 116 and output adjustment unit 119. Circuit 116 is identical to ADPCM Q adaptation circuit 16 of coder 100. The output of ADPCM Q adaptation circuit 116 is the quantizer adaptive scale factor $\Delta(k)$ which is delivered to the inverse ADPCM quantizer 115 for the same purpose as previously described in relationship to coder 101, and to output adjustment unit 119. ADPCM quantizer 115 and ADPCM Q adaptation circuit 116 form inverse dynamic locking quantizer $DLQ^{-1}$ which performs the function of generating $e_q(k)$. Adaptive predicator 112 serves to generate linear predicted sample $\hat{Y}(k)$ which is coupled to the other input of adder 118 and to output adjustment unit 119. Adaptive predictor 112 is identical to adaptive predictor 12 of coder 101. Adder 118 serves to digitally add input signal $e_q'(k)$ and predicted sample $\hat{Y}(k)$ to produce reconstructed signal $Y_r(k)$ which is a close quantized linear version of original PCM sample $\Psi(k)$. Reconstructed signal $Y_r(k)$ is delivered to the input of adaptive predictor 112 and to output adjustment unit 119. As will be described in more detail hereinafter, adjustment unit 119 includes an arrangement for adjusting, if necessary, reconstructed signal $Y_r(k)$, in accordance with an aspect of the invention, to generate adjusted reconstructed signal $\overline{Y}_r(k)$ when a so-called trial transmission of a resulting PCM code sample indicates that subsequent PCM-to-ADPCM coder 101 would generate an ADPCM code sample $I_{n+1}(k)$ different from the ADPCM code sample $I_n(k)$ received by decoder 100. To this end, output adjustment unit 119 generates composite noise value $\alpha(k)$ resulting from the trial transmission which is evaluated relative to the upper $dl_U[I_n(k)]$ and lower $dl_L[I_n(k)]$ ADPCM quantizer interval decision levels for sample $I_n(k)$ (FIG. 5). If composite noise value $\alpha(k)$ is not within the limits set relative to the ADPCM quantizer decision levels for $I_n(k)$, the value of reconstructed signal $Y_r(k)$ is adjusted by a value dependent on the corresponding PCM quantizer interval that reconstructed signal $Y_r(k)$ falls in and whether ADPCM sample $I_n(k)$ is in saturation, i.e., the most negative or most positive ADPCM quantizer interval, or whether the composite noise value $\alpha(k)$ is equal to or greater than the upper ADPCM quantizer decision level for $I_n(k)$ or less than the lower ADPCM quantizer decision level for $I_n(k)$. This insures that next subsequent coder 101 will choose the same ADPCM quantizer interval as received by decoder 100 and $I_{n+1}(k)$ will equal $I_n(k)$. Adjusted reconstructed signal $\overline{Y}_r(k)$ is then PCM quantized via PCM output quantizer 120 for transmission over channel 102 to subsequent ADPCM coder 101.

The composite noise value $\alpha(k)$ which includes both quantization noise and truncation noise is defined as the difference between the resulting trial transmission of reconstructed signal $Y_r(k)$, i.e., the resulting value after PCM quantizing $Y_r(k)$ and, then, PCM decoding that value to obtain a value equivalent to $Y(k)$ in coder 101, and predictor estimate $\hat{Y}(k)$ in decoder 100, namely, $$\alpha(k) = \text{PCM DECODED (PCM CODED} [Y_r(k)]) - Y(k) \quad (1)$$

Decoder 100 and coder 101 are shown in FIG. 1 in block diagram form to facilitate clarity of description. However, decoder 100 and coder 101 are implemented, in this example, in a digital signal processor (DSP), i.e., a programmable integrated circuit for signal processing. Any one of a number of digital signal processing units known in the art may be employed for this purpose. One such DSP unit is described in several articles in *The Bell System Technical Journal*, Vol. 60, No. 7, Part 2, dated September 1981 and is manufactured by Western Electric Company.

Figure 2:
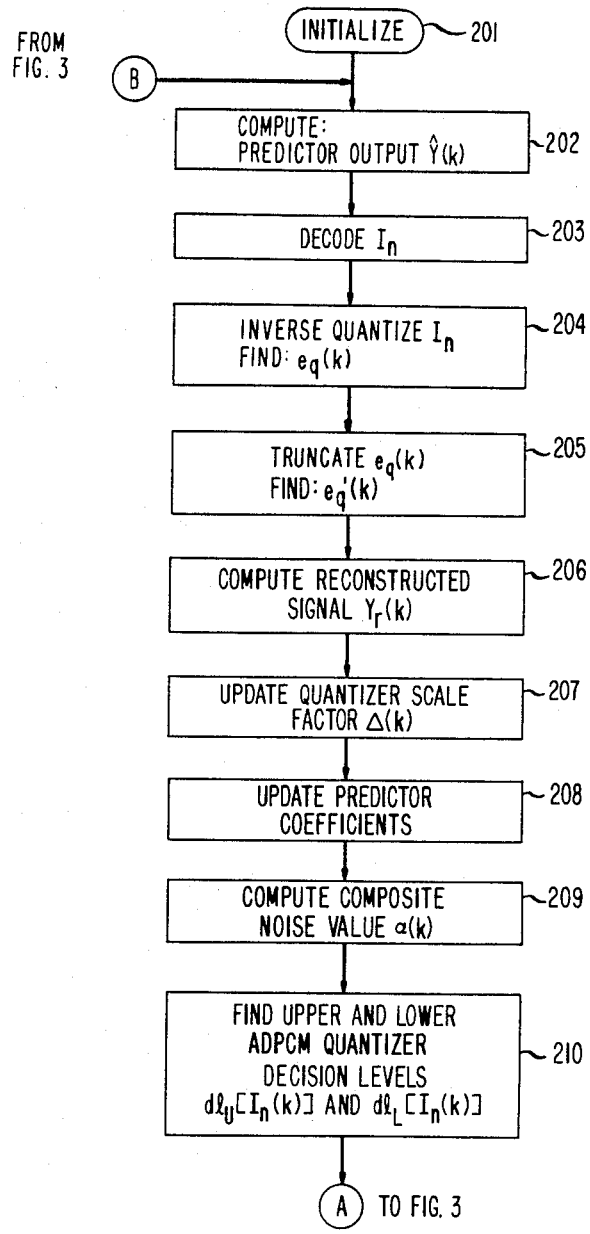
FIGS. 2 and 3 depict a flow chart describing the operation of the decoder of the embodiment of the invention shown in FIG. 1.
Figure 3:
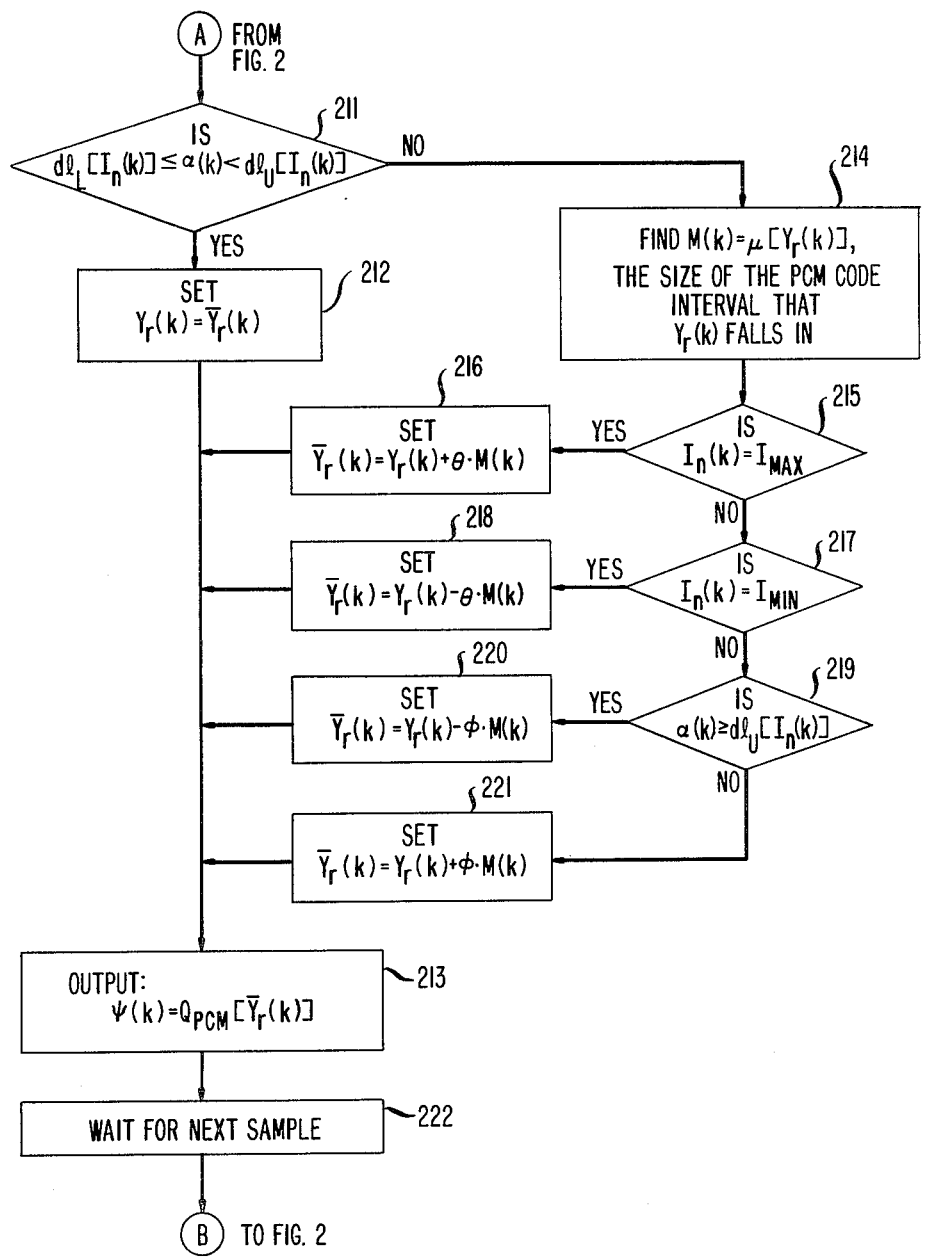

Accordingly, decoder 100 including an aspect of the invention is realized by programming a DSP unit. Operation of decoder 100, in accordance with an aspect of the invention, is described in conjunction with the digital program flow chart of FIGS. 2 and 3. FIGS. 2 and 3 when connected A—A and B—B form a flow chart of a program routine for converting digital samples $I_n(k)$ from a second code, e.g., 4-bit ADPCM, to digital samples $\Psi(k)$ in a first code, e.g., $\mu$255 PCM. Accordingly, the DSP is initialized via 201. Thereafter, predictor sample estimate $\hat{Y}(k)$ is computed in operational block 202. As noted above, details of the computation of the predicted sample $\hat{Y}(k)$ are described in the copending U.S. patent application, Ser. No. 343,355 cited above. Operational blocks 203 and 204 relate to the reception and decoding of the 4-bit differential PCM sample $I_n(k)$ and the generation or "finding" of the inverse ADPCM quantized version of $I_n(k)$, namely, the quantized version $e_q(k)$ of difference signal $e(k)$. Operational block 205 causes the digital value of $e_q(k)$ to be truncated. That is to say, the bits of $e_q(k)$ are limited to the integer portion and any fractional portion is truncated to yield $e_q'(k)$. Operational block 206 causes reconstructed signal $Y_r(k)$ to be computed by adder 118, namely, $Y_r(k) = e_q'(k) + \hat{Y}(k)$. Quantizer scale factor $\Delta(k)$ is updated in operational block 116 in known fashion. The adaptive predictor 112 coefficients are updated in operational block 208.

Then, composite noise value $\alpha(k)$ is computed in operational block 209. As indicated above, the composite noise value is obtained, in accordance with an aspect of the invention, by first making a trial transmission in output modification unit 119 of decoder 100 of linear reconstruction signal $Y_r(k)$. Thus, $Y_r(k)$ is PCM quantized e.g., $\mu$255 PCM, and then PCM decoded to generate the equivalent of $Y(k)$ in coder 101, which is a linear version of $\Psi(k)$. Then, the composite noise value is computed, namely, $\alpha(k) = Y(k) - \hat{Y}(k)$.

Operational block 210 finds the upper and lower decision levels for the ADPCM quantizer interval determined by sample $I_n(k)$ falls in, namely, $dl_U[I_n(k)]$ and $dl_L[I_n(k)]$, respectively, see FIG. 5.

Conditional branch point 211 evaluates, in accordance with an aspect of the invention, the composite noise value $\alpha(k)$ computed in operational block 209 to determine if it is within the ADPCM quantizer interval $I_n(k)$. That is, composite noise value $\alpha(k)$ is evaluated to determine whether it is equal to or greater than the lower ADPCM quantizer interval decision level ($dl_L$) for $I_n(k)$, and less than the upper ADPCM quantizer decision level ($dl_U$) for $I_n(k)$. If the evaluation result is YES, the value of reconstructed signal $Y_r(k)$ need not be adjusted and operational block 212 sets $Y_r(k) = \overline{Y}_r(k)$. Thereafter, control is transferred to operational block 213. However, if the evaluation result of step 211 is NO, adjustment of reconstructed signal $Y_r(k)$ is necessary to insure that coder 101 will generate an output ADPCM sample $I_{n+1}(k)$ equal to ADPCM sample $I_n$ received by decoder 100 and control is transferred to operational block 214.

Operational block 214 determines the size $M(k)$ of the $\mu 255$ PCM quantizer interval that reconstructed signal $Y_r(k)$ falls in. That is, $M(k) = \mu[Y_r(k)]$. $M(k)$ is used in conjunction with adjustment scaling factor $\phi$, in accordance with an aspect of the invention, in following program steps so that the adjustment to reconstructed signal $Y_r(k)$ is neither too large nor too small, which would result in overcorrecting or undercorrecting, respectively, of the reconstructed signal. That is to say, the adjustment to reconstructed signal $Y_r(k)$ for compensating for the composite noise should not be so large as to cause the resulting adjusted reconstructed signal $\overline{Y}_r(k)$ to fall in a PCM quantizer interval which is not adjacent to the interval $Y_r(k)$ falls in. $M(k)$ is also used with adjustment scaling factor $\theta$ when $I_n(k)$ is either the maximum ADPCM quantizer interval $I_{MAX}$ or the minimum ADPCM quantizer interval $I_{MIN}$ in order to minimize the amount of quantizer noise introduced. Selection of values for adjustment scaling factors $\phi$ and $\theta$ is described below.

Conditional branch point 215 tests to determine if $I_n(k)$ is the maximum ADPCM quantizer interval $I_{MAX}$. In this example, $I_{MAX}$ is ADPCM quantizer interval 7 of FIG. 5. If the test result is YES, $I_n(k)$ is in saturation, i.e., the maximum ADPCM quantizer interval and operational block 216 causes reconstructed signal $Y_r(k)$ to be adjusted by a scaled value $\theta \cdot M(k)$, in accordance with an aspect of the invention, to yield an adjusted reconstructed signal $\overline{Y}_r(k)$, namely $\overline{Y}_r(k) = Y_r(k) + \theta \cdot M(k)$, where in this example $\theta$ equals 0.6. Thereafter, control is transferred to operational block 213. If the test result in step 215 is NO, conditional branch point 217 determines if $I_n(k)$ is the minimum ADPCM quantizer interval or negative saturation, in this example, $I_{MIN}$ is ADPCM quantizer interval $-8$ of FIG. 5. If the result in step 217 is YES, $I_n(k)$ is in negative saturation and operational block 218 causes reconstructed signal $Y_r(k)$ to be adjusted also by the scaled value $\theta \cdot M(k)$, in accordance with an aspect of the invention, to yield an adjusted reconstructed signal $\overline{Y}_r(k)$, namely, $\overline{Y}_r(k) = Y_r(k) - \theta \cdot M(k)$. Again, it is important to insure that the adjustment to $Y_r(k)$ when in positive or negative saturation is not so large that unwanted additional quantizing noise is added. This additional quantizing noise can occur since the upper ADPCM decision level for positive saturation, i.e., step 7, is $+\infty$ and the lower ADPCM decision level for negative saturation, i.e., step $-8$, is $-\infty$. Thereafter, control is transferred to operational block 213.

If the test result in step 217 is NO, conditional branch point 219 determines whether the corresponding composite noise value $\alpha(k)$ is equal to or greater than the upper ADPCM quantizer decision level for $I_n(k)$, namely $\alpha(k) \geq dl_U[I_n(k)]$. If the result in step 219 is YES, operational block 220 causes an adjusted reconstructed signal $\overline{Y}_r(k)$ to be generated by decreasing the value of reconstructed signal $Y_r(k)$ by a scaled value $\phi \cdot M(k)$, in accordance with an aspect of the invention, where in this example, $\phi$ equals 0.3. This scaled adjustment insures that adjusted reconstructed signal $\overline{Y}_r(k)$ falls in the lower adjacent PCM quantizer interval to the interval that reconstructed signal $Y_r(k)$ falls in. Thereafter, control is transferred to operational block 213. Control is transferred to operational block 213.

If the result in step 219 is NO, operational block 221 causes a scaled value $\phi \cdot M(k)$ to be added to reconstructed signal $Y_r(k)$, in accordance with an aspect of the invention, to yield an adjusted reconstructed signal $\overline{Y}_r(k)$, namely, $\overline{Y}_r(k) = Y_r(k) + \phi \cdot M(k)$. Here again, the scaled adjustment insures that adjusted reconstructed signal $Y_r(k)$ falls in the higher adjacent PCM quantizer interval to the interval that reconstructed signal $Y_r(k)$ falls in. Thereafter, control is transferred to operational block 213.

The adjustment to reconstruct signal $Y_r(k)$ insures, in accordance with an aspect of the invention, that the corresponding PCM coded signal $\Psi(k)$ is in the appropriate PCM quantizer interval so that coder 101 will ultimately generate an ADPCM sample $I_{n+1}(k)$ equal to $I_n(k)$ received by decoder 100.

Operational block 213 causes adjusted reconstructed signal $\overline{Y}_r(k)$ to be PCM quantized to yield PCM sample $\Psi(k)$ which is outputted for transmission to a subsequent coder or to be utilized as desired. In this example, $\mu 255$ PCM quantizing is employed. Thereafter, decoder 100 waits in operational block 222 for the next ADPCM sample $I_n(k)$ to be received. Then, control is returned to operational block 202 and the ADPCM-to-PCM decoder process is repeated.

In summary, steps 209 through 221 are included in decoder 100 to insure, in accordance with an aspect of the invention, that a subsequent ADPCM coder 101 will ultimately generate an ADPCM sample $I_{n+1}(k)$ equal to the ADPCM sample $I_n(k)$ received by decoder 100. This is realized by obtaining composite noise value $\alpha(k)$ through making a "trial" PCM transmission of reconstructed signal $Y_r(k)$ then, evaluating composite noise value $\alpha(k)$ relative to the upper and lower ADPCM quantizer decision levels for ADPCM sample $I_n(k)$. If the composite noise value is not within the decision levels, the reconstructed signal $Y_r(k)$ must be adjusted to insure that coder 101 will generate an ADPCM sample equal to the ADPCM sample received by decoder 100. An adjustment value is determined dependent on the size $M(k)$ of the PCM quantizer interval that reconstructed signal $Y_r(k)$ falls in and a first predetermined adjustment scaling factor $\theta$ if $I_n(k)$ is in saturation and a second predetermined adjustment scaling factor $\phi$ if $I_n(k)$ is not in saturation. Then, reconstructed signal $Y_r(k)$ is adjusted, if necessary, by the adjustment value to yield adjusted reconstructed signal $\overline{Y}_r(k)$. The value of the adjustment is dependent on whether sample $I_n(k)$ is the maximum ADPCM quantizer interval or the minimum ADPCM quantizer interval or, if not either the maximum or minimum ADPCM quantizer intervals, whether composite noise value $\alpha(k)$ is greater than or equal to the upper ADPCM quantizer decision level $dl_U[I_n(k)]$ or less than the lower ADPCM quantizer decision level $dl_L[I_n(k)]$, for $I_n(k)$. Thus, if $I_n(k)$ is not the most positive or negative ADPCM quantizer interval, i.e., not in saturation, the reconstructed signal value $Y_r(k)$ is decreased by $\phi \cdot M(k)$ when the composite noise value $\alpha(k)$ is equal to or greater than the upper decision level $dl_U[I_n(k)]$ for sample $I_n(k)$ and increased by $\phi \cdot M(k)$ when $\alpha(k)$ is less than the lower decision level $dl_L[I_n(k)]$ for sample $I_n(k)$. Thus, when the composite noise $\alpha(k)$ causes the reconstructed signal $Y_r(k)$ to fall in either a next higher or next lower PCM quantizer interval than desired, its value is decreased or increased, respectively, so that the adjusted reconstructed signal $Y_r(k)$ falls in the desired PCM quantizer interval. The use of the PCM quantizer interval size $M(k)$ that reconstructed signal $Y_r(k)$ falls in insures, in accordance with an aspect of the invention, that the reconstructed signal $Y_r(k)$ is adjusted by a value that is not too large or too small, thereby eliminating the possibility of over correcting or under correcting. Similarly, if $I_n(k)$ is the most positive or most negative ADPCM quantizer interval, i.e., in saturation, reconstructed signal value $Y_r(k)$ is increased or decreased, respectively, by $\theta \cdot M(k)$.

As indicated above adjustment scaling factors $\phi$ and $\theta$ are employed, in accordance with an aspect of the invention, to insure that reconstructed signal $Y_r(k)$ is not over adjusted or under adjusted, thereby insuring that a subsequent PCM-to-ADPCM coder will generate an ADPCM sample $I_{n+1}(k)$ equal to the ADPCm sample $I_n$ received by the present decoder 100. Accordingly, the value of adjustment scaling factor $\phi$ is dependent on the ADPCM quantizer characteristic being employed and, specifically, on the error boundaries of that characteristic. It is known that the negative slope error boundary is $-1$. The positive slope error boundary $\gamma$ is defined by $$\gamma = \underset{I_n(k)}{\text{MINIMUM}} \left[ \left| \frac{dl_L[I_n(k)] - o[I_n(k)]}{dl_U[I_n(k)] - o[I_n(k)]} \right| \right] \quad (2)$$

A worst case condition for adjustment scaling factor $\phi$ occurs when the composite noise causes the reconstructed signal $Y_r(k)$ to fall in a PCM quantizer interval in a different chord than $Y(k)$. Thus, the maximum value for $\phi$ is determined by the ratio (R) of quantizer interval sizes at a chord boundary, namely, $R = (M_l(k)/M_h(k))$ where $M_l(k)$ is the interval size for the lower chord and $M_h(k)$ is he interval size for the higher chord at the chord boundary. It is known that for $\mu$-law PCM the quantizer interval size doubles from one chord to the next higher chord. Therefore, the value of adjustment scaling factor $\phi$ has an upper limit of R'0.5 less a small value to compensate for skewing of the quantization error characteristic caused by the truncation noise. The positive slope and negative slope error boundaries when superimposed on the PCM quantization error characteristic define the minimum value that adjustment scaling factor $\phi$ must be to adjust the reconstructed signal $Y_r(k)$ to fall in the proper PCM quantizer interval for coder 101 to generate an ADPCM sample $I_{n+1}(k)$ equal to the ADPCM sample $I_n(k)$ received by decoder 100. Thus, the minimum value for adjustment scaling factor $\phi$ is determined by the ratio of a projection (v) on a horizontal axis of the error boundary segment formed by the positive slope error boundary intersecting the PCM error characteristic in the PCM quantizer interval that reconstructed signal $Y_r(k)$ falls in and the size $M(k)$ of the PCM quantizer interval, i.e., $\phi_{MIN} = (v/M(k))$. Then, it will be apparent to those skilled in the art that $$\phi_{MIN} = \frac{1}{4}\left(\frac{2-\gamma}{1+\gamma}\right) \quad (3)$$

In one example, the slope of the positive slope error boundary slope $\gamma$ is approximately $\frac{5}{8}$. Therefore, from equation (3) the minimum value for adjustment scaling factor $\phi$ is 0.2 in order to properly correct reconstructed signal $Y_r(k)$. However, because of skewing of the corresponding PCM error characteristic that occurs from finite arithmetic effects, i.e., the truncating of the quantized error signal $e_g(k)$, a somewhat larger value is selected for $\phi$, in this example, $\phi = 0.3$. It is noted, that the value of adjustment scaling factor $\phi$ can approach 0.5 or one-half the size of $M(k)$ of the corresponding PCM quantizer interval. However, the value of adjustment scaling factor $\phi$ cannot be so large that the resulting adjusted reconstructed signal $\overline{Y}_r(k)$ falls in a PCM quantizer interval not adjacent to the PCM quantizer interval that reconstructed signal $Y_r(k)$ falls in. Again, the $\phi = 0.3$ value is for $\mu$-law PCM.

Figure 4:
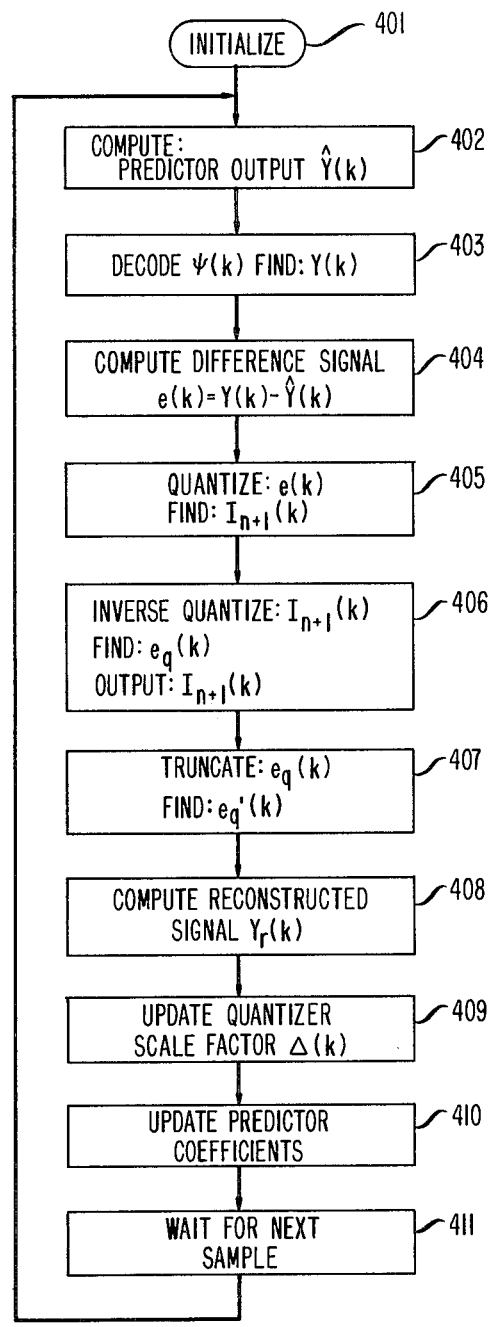
FIG. 4 shows a flow chart describing operation of the coder shown in FIG. 1 and FIG. 6.

FIG. 4 depicts a flow chart of a program routine for converting digital signals from a first code, e.g., $\mu$-law PCM to a second code, e.g., 4-bit ADPCM, namely, the operation of coder 101. Accordingly, the DSP is initialized via 401. The predictor sample estimate $\hat{Y}(k)$ is computed via operational block 402. As noted above, details of the predictor computation are described in copending U.S. patent application, Ser. No. 343,355. Operational block 403 causes received PCM samples $\Psi(k)$ to be decoded and converted to linear PCM form, namely, $Y(k)$. Operational block 404 causes the computation of difference signal $e(k)$, which comprises the difference between linear samples $Y(k)$ and predicted sample estimate $\hat{Y}(k)$, namely, $e(k) = Y(k) - \hat{Y}(k)$. Difference signal $e(k)$ is ADPCM quantized via operational block 405, for example, in accordance with the nonuniform ADPCM quantizer characteristic of FIG. 5, to obtain 4-bit differential PCM output sample $I_{n+1}(k)$. Operational block 406 causes $I_{n+1}(k)$ to be inverse ADPCM quantized to find value $e_q(k)$ and, then, the 4-bit differential PCM samle $I_{n+1}(k)$ is outputted. Operational block 407 causes $e_q(k)$ to be truncated to yield $e_q'(k)$. That is, the digital value of $e_q(k)$ is limited to being an integer and any bits representing a fractional portion are eliminated. Operational block 408 causes reconstructed signal $Y_r(k)$ to be computed, namely, $Y_r(k) = e_q'(k) + \hat{Y}(k)$ which is in linear PCM form. Lastly, the adaptive predictor coefficients are updated in operational block 410. Once step 410 is completed, coder 101 waits in block 411 for the next PCM input sample $\Psi(k)$. Then, control is transferred to operational block 402 and the PCM-to-ADPCM coder process is repeated.

Figure 6:
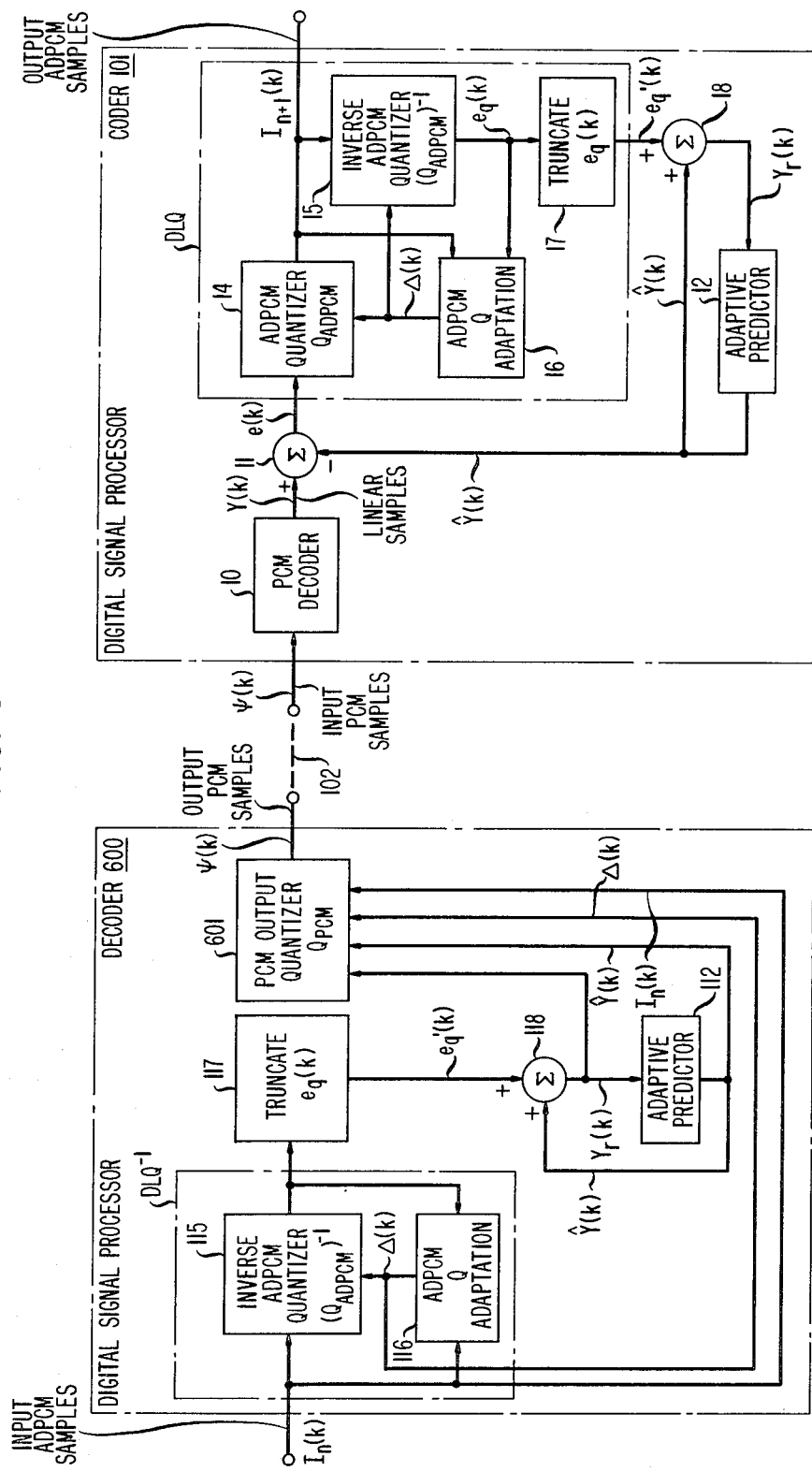
FIG. 6 depicts in simplified block diagram form a code converter including another embodiment of the invention.

FIG. 6 shows in simplified block diagram form a codec including another embodiment of the invention. Coder 101 is identical to coder 101 shown in FIG. 1 and operates in accordance with the flow chart shown in FIG. 4. Accordingly, the elements of coder 101 of FIG. 6 have been numbered the same as coder 101 of FIG. 1 and will not be described again in detail.

Decoder 600 of FIG. 6 is similar to decoder 100 of FIG. 1. Elements of decoder 600 which are the same as those used in decoder 100 of FIG. 1 have been similarly numbered and will not be described again. The difference between decoder 600 and decoder 100 is that output adjustment unit 119 (FIG. 1) has been eliminated and PCM output quantizer 601 (FIG. 6) includes an arrangement for controllably adjusting, in accordance with an aspect of the invention, the quantizer interval of PCM samples $\Psi(k)$ in order to insure that subsequent coder 101 will ultimately generate an ADPCM sample $I_{n+1}(k)$ equal to the ADPCM sample $I_n(k)$ received by decoder 600. As in decoder 101, the adjustment to PCM sample $\Psi(k)$, if needed, is determined by evaluating composite noise value $\alpha(k)$ for ADPCM sample $I_n(k)$, composite noise value $\alpha(k)$ is generated in PCM output quantizer 601. To this end, the received ADPCM sample $I_n(k)$, quantizer scale factor $\Delta(k)$, predictor estimate $\hat{Y}(k)$ and reconstructed signal $Y_r(k)$ are supplied to PCM output quantizer 601. Quantizer 601 generates the composite noise value $\alpha(k)$ for ADPCM sample $I_n(k)$ which is evaluated relative to the upper $dl_U[I_n(k)]$ and lower $dl_L[I_n(k)]$ ADPCM quantizer interval decision levels (FIG. 5) for sample $I_n(k)$. If composite noise value $\alpha(k)$ is not within limits set in relationship to the upper and lower ADPCM quantizer decision levels for $I_n(k)$, the PCM interval for PCM sample $\Psi(k)$ must be adjusted. The adjustment is up or down one (1) PCM quantizer interval dependent on whether ADPCM sample $I_n(k)$ is in positive saturation, negative saturation or whether composite noise $\alpha(k)$ is equal to or greater than the upper ADPCM quantizer decision level $dl_U[I_n(k)]$ or less than the lower ADPCM quantizer decision level $dl_L[I_n(k)]$ for sample $I_n(k)$. Again, this ensures that next subsequent coder 101 will choose the ADPCM quantizer interval as received by decoder 600 and $I_{n+1}(k)$ equals $I_n(k)$.

Decoder 600 and coder 101 are shown in FIG. 6 in block diagram form to facilitate clarity of description. However, decoder 600 and coder 101 are implemented, in this example, in a digital signal processor (DSP), i.e., a programmable integrated circuit for signal processing. Any one of a number of digital signal processing units known in the art may be employed for this purpose. One such DSP unit is manufactured by Western Electric Company as noted above.

Figure 7:
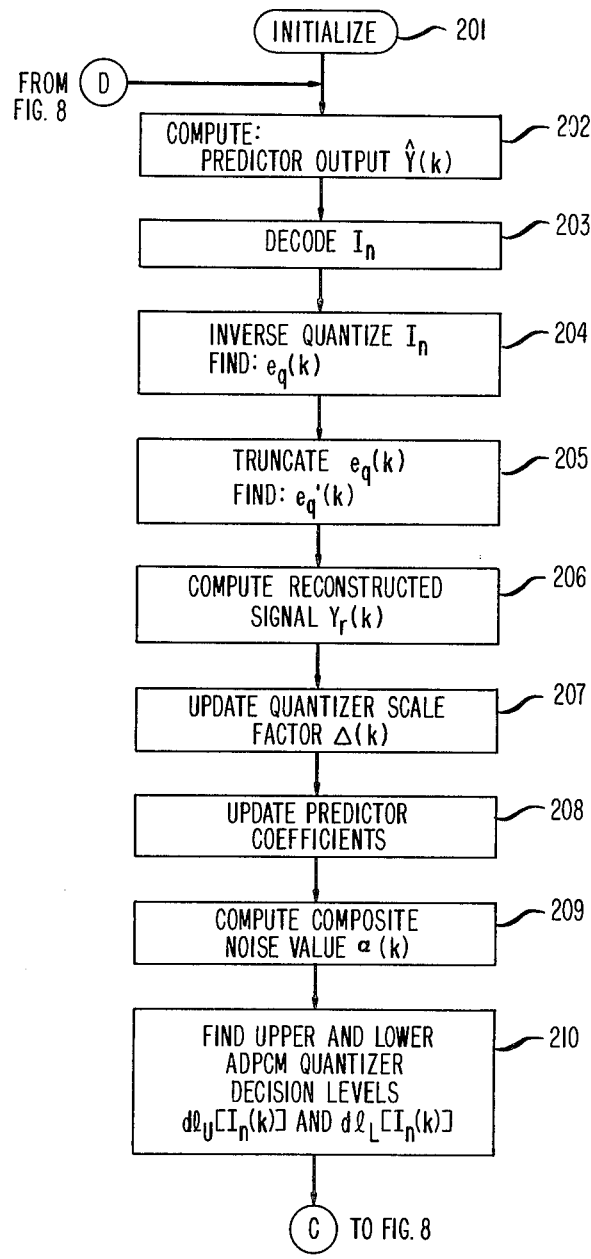
FIGS. 7 and 8 show a flow chart describing the operation of the decoder of the embodiment of the invention shown in FIG. 6.
Figure 8:
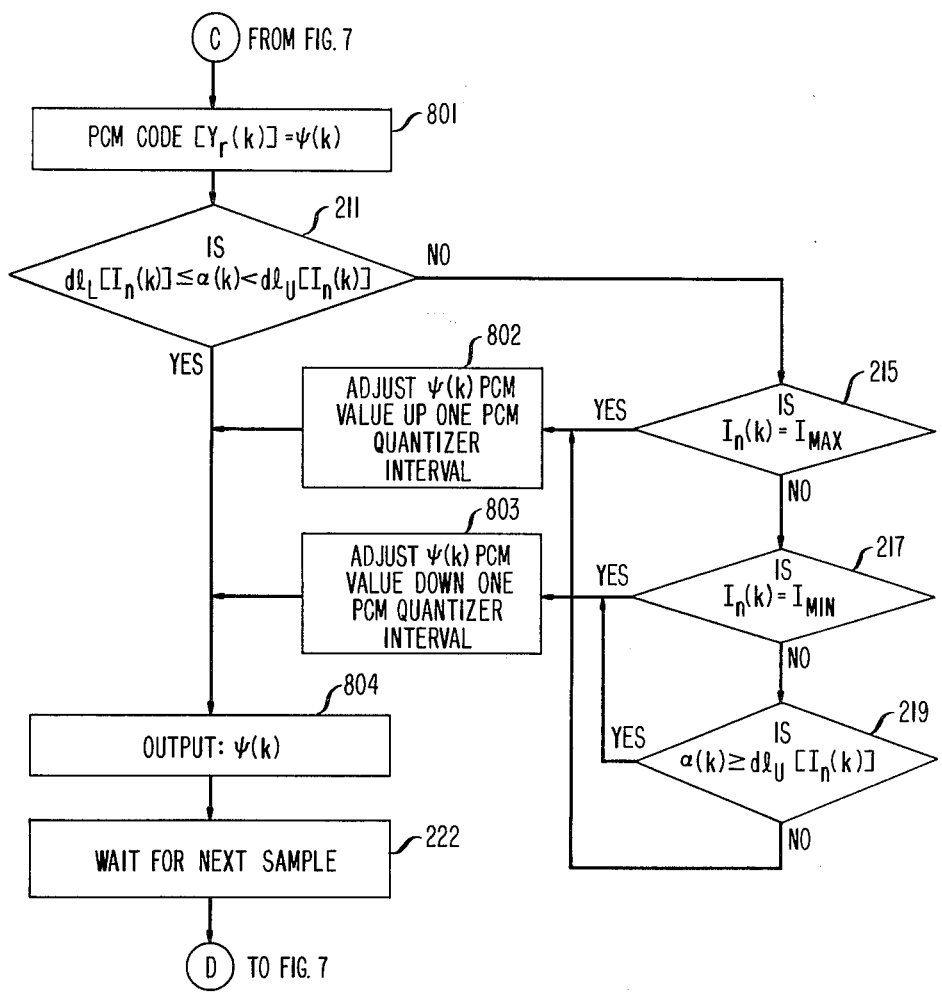

Accordingly, decoder 600 including an aspect of the invention is realized by programming a DSP unit. Therefore, operation of decoder 600, in accordance with an aspect of the invention, is described in conjunction with the digital program flow chart of FIGS. 7 and 8. FIGS. 7 and 8 when connected C-C and D-D form a flow chart of a program routine for converting digital samples $I_n(k)$ from a second code, e.g., 4-bit ADPCM, to digital samples $\Psi(k)$ in a first code, e.g., $\mu 255$ PCM. Since decoder 600 is similar to decoder 100, operation of which is described in the flow chart of FIGS. 2 and 3, the steps in the flow chart of FIGS. 7 and 8 which are identical to the steps in FIGS. 2 and 3 have been similarly numbered and are not described again in detail. Accordingly, steps 201 through 210 are identical to those in FIG. 2. Operational block 801 causes reconstructed signal $Y_r(k)$ generated in step 206 to be PCM quantized for obtaining PCM sample $\Psi(k)$. Conditional branch point 211 as in FIG. 3 evaluates the composite noise value $\alpha(k)$ relative to the upper and lower ADPCM interval decision levels for $I_n(k)$. That is, composite noise value $\alpha(k)$ is tested to determine whether it is equal to or greater than lower decision level $dl_L[I_n(k)]$, and less than the upper decision level $dl_U[I_n(k)]$. If the evaluation result of step 211 is YES, the PCM quantizer interval that PCM sample $\Psi(k)$ does not need to be adjusted and control is transferred to operational block 804. If the evaluation result in step 211 is NO, adjustment of the PCM quantizer interval of PCM sample $\Psi(k)$ is necessary to insure that coder 101 would generate an output ADPCM sample $I_{n+1}(k)$ equal to ADPCM sample $I_n(k)$ received by decoder 600. Accordingly, conditional branch point 215 determines if $I_n(k)$ is the maximum ADPCM quantizer interval $I_{MAX}$. If the result of step 215 is YES, operational block 802 causes PCM sample $\Psi(k)$ to be adjusted up one PCM quantizer interval and, thereafter, control is transferred to operational block 804. If the result of step 215 is NO, conditional branch point 217 determines if $I_n(k)$ is the minimum ADPCM quantizer interval $I_{MIN}$. If the result of step 217 is YES, operational block 803 causes PCM sample $\Psi(k)$ to be adjusted down one PCM quantizer interval and, thereafter, control is transferred to operational block 804. If the result of step 217 is NO, conditional branch point 219 determines whether composite noise value $\alpha(k)$ is equal to or greater than the upper ADPCM quantizer interval decision level $dl_U[I_n(k)]$ for $I_n(k)$. If the test result in step 219 is YES, operational block 803 causes PCM sample $\Psi(k)$ to be adjusted down one PCM quantizer interval and, thereafter, control is transferred to operational block 804. If the result of step 219 is NO, operational block 802 causes PCM sample $\Psi(k)$ to be adjusted up on PCM quantizer interval and, thereafter, control is transferred to operational block 804.

Operational block 804 causes PCM sample 804 to be outputted for transmission over communication channel 102 (FIG. 6). Thereafter, decoder 600 waits in operational block 222 for the next ADPCM sample $I_n(k)$ to be received. Then, control is transferred to operational block 202 and the ADPCM-to-PCM decoder process is repeated.

It should be noted, that adjustment to the PCM sample $\Psi(k)$ in PCM output quantizer 601 (FIG. 6) may not be easily obtained in a DSP. However, the adjustment to linear reconstructed signal $Y_r(k)$ in output adjustment unit 119 (FIG. 2) is readily realizable in a DSP.

The above arrangements are only examples of embodiments of the invention. It will be apparent to those skilled in the art that various changes in form and detail may be made without departing from the spirit or scope of the invention. Indeed, other then $\mu$-law PCM and ADPCM code schemes may be employed. For example, an A-law PCM coding scheme may be employed in place of the $\mu$-law PCM. Moreover, either the ADPCM or PCM quantizer may employ any non-uniform or uniform quantizing characteristic.

What is claimed is:

1. A decoder for converting quantized digital samples in a second code to quantized digital samples in a first code, each of said second code digital samples falling within one of a plurality of second code quantizer intervals and each of said first code digital samples falling within one of a plurality of first code quantizer intervals, including inverse adaptive quantizer means for receiving said second code digital samples and providing at its output a quantized version of the original difference signal that was encoded into said second code sample, means supplied with said quantized version of said difference signal for generating a reconstructed signal which is a linear version of the original first code sample which was quantized into said second code sample, said decoder being characterized by, means for generating a first code sample version of said reconstructed signal, means for making a trial transmission of said first code sample version to obtain a composite noise value, means for evaluating said composite noise value relative to prescribed limits determined in a predetermined relationship to the second code quantizer interval said received second code sample falls in, and means for adjusting said first code sample quantizer interval that said generated first code sample version of said reconstructed signal falls in when said composite noise value is not within said prescribed limits.

2. A decoder as defined in claim 1 wherein said decoder further includes means for obtaining a first code predicted estimate sample corresponding to said second code sample being converted, and wherein said means for making a trial transmission includes means for first code decoding said first code sample version and means for obtaining the algebraic difference between said decoded first code sample version and said corresponding first code predicted estimate.

3. A decoder as defined in claim 1 wherein said evaluating means includes means for obtaining upper and lower limits dependent on said second code sample quantizer interval that said received second code sample falls in, said upper and lower limits being said prescribed limits, and means for determining whether said composite noise value is within said prescribed upper and lower limits.

4. A decoder as defined by claim 3 wherein said adjusting means includes means for determining whether said second code sample is a most positive second code quantizer interval, means for determining whether said second code sample is a most negative second code quantizer interval, means for determining whether said composite noise value violates said prescribed upper limit or said prescribed lower limit, first means for adjusting said first code sample up one first code quantizer interval when said second code sample is said most positive second code quantizer interval or when said composite noise value violates said prescribed lower limit and second means for adjusting said first code sample down one first code quantizer interval when said second code sample is the most negative second code quantizer interval or when said composite noise value violates said prescribed upper limit.

5. A decoder as defined in claim 4 wherein said upper prescribed limit is an upper decision level for said second code sample quantizer interval and said lower prescribed limit is a lower decision level for said second code sample quantizer interval, said upper limit is violated when said composite noise value is equal to or greater than said upper decision level and said lower limit is violated when said composite noise value is less than said lower decision level.

6. A decoder as defined in claim 5 wherein said first code is pulse code modulation (PCM) and said second code is adaptive differential PCM(ADPCM).

7. A decoder as defined in claim 6 wherein said PCM code is $\mu$-law and said ADPCM code is four bit ADPCM.

8. A decoder for converting quantized digital samples in a second code to quantized digital samples in a first code, each of said second code digital samples falling within one of a plurality of second code quantizer intervals and each of said first code digital samples falling within one of a plurality of first code quantizer intervals, including inverse adaptive quantizer means for receiving said second code digital samples and providing at its output a quantized version of the original difference signal that was encoded into said second code sample, means supplied with said quantized version of said difference signal for generating a reconstructed signal which is a linear version of the original first code sample which was quantized into said second code sample, said decoder being characterized by, means for generating a first code sample version of said reconstructed signal, means for making a trial transmission of said first code sample version to obtain a composite noise value, means for evaluating said composite noise value relative to prescribed limits determined in a predetermined relationship to the second code quantizer interval said received second code sample falls in, and means for adjusting said reconstructed signal when said composite noise value is not within said prescribed limits, so that a first code sample resulting from first code quantizing said reconstructed signal falls in a first code quantizer interval which will cause a subsequent first-to-second code coder to generate a second code sample equal to said second code sample, being converted in the decoder.

9. A decoder as defined in claim 8 wherein said decoder further includes means for obtaining a first code predicted estimate sample corresponding to said second code sample being converted, and wherein said means for making a trial transmission includes means for first code decoding said first code sample version and means for obtaining the algebraic difference between said decoded first code sample version and said corresponding first code predicted estimate.

10. A decoder as defined in claim 8 wherein said evaluating means includes means for obtaining upper and lower limits dependent on said second code sample quantizer interval, said upper and lower limits being said prescribed limits and means for determining whether said composite noise value is within said prescribed upper and lower limits.

11. A decoder as defined in claim 10 wherein said adjusting means includes means for obtaining a value representative of a first code quantizer interval size that said reconstructed signal falls in and means for adjusting the value of said reconstructed signal by a first value equal to said first code quantizer interval size scaled by at least one predetermined adjustment scaling factor.

12. A decoder as defined in claim 11 wherein said at least one predetermined adjustment scaling factor is determined by a prescribed relationship between a second code quantizer characteristic and a first code error characteristic.

13. A decoder as defined in claim 12 wherein said prescribed relationship is related to positive and negative slope second code error boundaries determined by said second code quantizer characteristic and said error boundaries being superimposed on said first code error characteristic.

14. A decoder as defined in claim 10 wherein said adjusting means includes means for obtaining a value representative of a first code quantizer interval size that said reconstructed signal falls in, means for determining whether said second code sample is a most positive second code quantizer interval, means for determining whether said second code sample is a most negative second code quantizer interval, means for determining whether said composite noise value violates said prescribed upper limit or said prescribed lower limit, first means for adjusting said reconstructed signal value by algebraically summing said reconstructed signal with a first value dependent on said first code quantizer interval size when said second code sample is said most positive second code quantizer interval, second means for adjusting said reconstructed signal value by obtaining an algebraic difference between said reconstructed signal and said first value when said second code sample is said negative most second code quantizer interval, third means for adjusting said reconstructed signal value by algebraically summing said reconstructed signal value with a second value dependent on said first code quantizer interval size when said composite noise value violates said prescribed lower limit and fourth means for adjusting said reconstructed signal value by obtaining the algebraic difference between said reconstructed signal value and said second value when said composite noise value violates said prescribed upper limit.

15. A decoder as defined in claim 14 wherein said first value is said first code quantizer interval size that said reconstructed signal falls in scaled by a first predetermined adjustment scaling factor and said second value is said first code quantizer interval size scaled by a second predetermined adjustment scaling factor.

16. A decoder as defined in claim 15 wherein said first adjustment scaling factor is a value greater than the ratio of a lower first code quantizer interval value to a higher first code quantizer interval at a first code quantizer chord boundary.

17. A decoder as defined in claim 15 wherein said second adjustment scaling factor is a value greater than a value determined by a prescribed relationship between a second code quantizer characteristic and a first code error characteristic and less than said ratio of first code quantizer interval values.

18. A decoder as defined in claim 17 wherein said prescribed relationship includes the superposition of positive and negative slope error boundaries of said second code quantizer characteristic on said first code error characteristic.

19. A decoder as defined in claim 18 wherein said second adjustment scaling factor is defined by $$\frac{1}{4}\left(\frac{2-\gamma}{1+\gamma}\right) < \phi < R$$

where $\phi$ is the value for said second adjustment scaling factor, and $\gamma$ is said positive slope error boundary value and R is the ratio of said lower first code chord quantizer interval size to said higher first code qunatizer interval size at a first code quantizer boundary.

20. A decoder as defined in claim 19 wherein said first code is $\mu$-law pulse code modulation (PCM) and said second code is adaptive differential PCM (ADPCM).

* * * * *